United States Patent [19]
Nishikubo et al.

[11] Patent Number: 5,790,066
[45] Date of Patent: Aug. 4, 1998

[54] REMOTE CONTROL TRANSMISSION CIRCUIT

[75] Inventors: Tetsuya Nishikubo; Makoto Suzuki. both of Hyogo-ken. Japan

[73] Assignee: Mitsubishi Denki Kabushiki Kaisha. Tokyo, Japan

[21] Appl. No.: 826,699

[22] Filed: Jan. 28, 1992

[30] Foreign Application Priority Data

Jan. 31, 1991 [JP] Japan .................................. 3-031769

[51] Int. Cl.$^6$ .............................. G08C 19/16; H04B 1/04
[52] U.S. Cl. ...................... 341/177; 341/176; 341/187; 377/67; 377/70
[58] Field of Search .............................. 341/176–178. 341/183, 187; 377/64, 67, 70, 71; 358/94.1; 340/825.56; H04N 7/00

[56] References Cited

U.S. PATENT DOCUMENTS 4,646,245  2/1987  Prodel et al. .
4,654,512  3/1987  Gardosil .
4,669,047  5/1987  Chucta .
4,759,123  7/1988  Ohta et al. .
4,901,242  2/1990  Kotan .

*Primary Examiner*—Michael Horabik

[57] ABSTRACT

A remote control transmission circuit for generating a multicarrier under control of a single microcomputer. This transmission circuit is arranged so as to allow reduction of the number of the program commands and making it easy to perform a different process during the output of the multicarrier. The number of the shift circuits of the shift circuits $2a$ to $2f$ which are connected is set by a switching circuit 4. A change-over switch 6 performs the change-over operation as to whether a new shift circuit 5 is coupled. The change-over switch 6 is controlled by an overflow signal of a counter 7 whose count source is an inversion signal of the carrier (multicarrier) output 1. The control of the change-over switch 6 automatically controls the period for the correction of the carrier output 1 without the control due to the microcomputer.

7 Claims, 4 Drawing Sheets

5,790,066

1
REMOTE CONTROL TRANSMISSION CIRCUIT

BACKGROUND OF THE INVENTION

Field of the Invention

The present invention relates to remote control transmitters for controlling lighting equipment and AV equipment such as a TV, and particularly to a remote control transmission circuit for outputting carriers with different formats at different frequencies under control of a single microcomputer.

FIG. 4 is a block diagram showing a conventional remote control transmission circuit to be used for outputting carriers with different formats (which will be referred hereinafter to as multicarriers) at different frequencies under control of one microcomputer. In the illustration, numeral 1 represents a carrier output, 21 designates a port control circuit for outputting the carrier 1, 22 depicts a port set signal to be outputted from a microcomputer 20 to the port control circuit 21, and 23 is a port reset signal to be similarly outputted from the microcomputer 20 to the port control circuit 21. FIG. 5 is an illustration of one example of multicarrier output waveforms.

Secondly, a description will be made hereinbelow in terms of the operation. In the case of outputting carriers with different frequencies by a single microcomputer 20, with the port control circuit 21 being controlled by the port set signal 22 and port reset signal 23 to be directly set through the software, the carrier 1 with a period close to the required frequency is outputted. For example, as illustrated in FIG. 5, the port set signal 22 is outputted at the m point by means of the software so as to set the carrier 1 to "H" and then to take a waiting time up to the n point by the software, and the port reset signal 23 is outputted at the n point so as to set the carrier 1 to "L". After taking a waiting time up to the o point, the port set signal 22 is outputted at the o point so that the carrier 1 is set to "H" and outputted.

In order for approaching the closer frequency, as shown in FIG. 5, the "L" time period (for example, the period between the points p and a) is adjusted one time for two periods by the software, before outputting the carrier 1. This is so-called multicarrier system, which allows the prevention of the error recognition due to the receiver disposed between the other company-made receivers. In the case of generating the multicarrier, there is a problem which arises with the conventional remote control transmission circuit thus arranged, however, in that the carrier output is required to be always controlled by the software to increase the number of the program commands concurrently with making it to perform a different process while outputting the carrier.

The present invention has been developed in order to remove the aforementioned problems, and contemplates to reduce the program command number and further allow execution of a different process during the output of the carrier by producing, by means of a hardware, a waveform which is the same as the waveform which is being outputted by means of the software.

SUMMARY OF THE INVENTION

A remote control transmission circuit according to the present invention comprises a plurality of shift circuits, a first switching circuit for determining the number of the basic connections of the shift circuits, a second switching circuit for performing the switching between the case that a loop is constructed with only shift circuits determined by the

2 first switching circuit and the case that the loop is constructed by newly adding a new shift circuit, and a switching control circuit for counting the output of the loop to switch the second switching circuit at a predetermined time interval, the multicarrier being constructed by means of a hardware and outputted.

According to the remote control transmission circuit of this invention, the multicarrier is constructed by the hardware and hence, if being set once, the correction of the carrier can automatically be made without operation due to the microcomputer.

The above and other objects, features, and advantages of the Invention will become more apparent from the following description when taken in conjunction with the accompanying drawings.

DESCRIPTION OF THE PREFERRED EMBODIMENT

Figure 1:
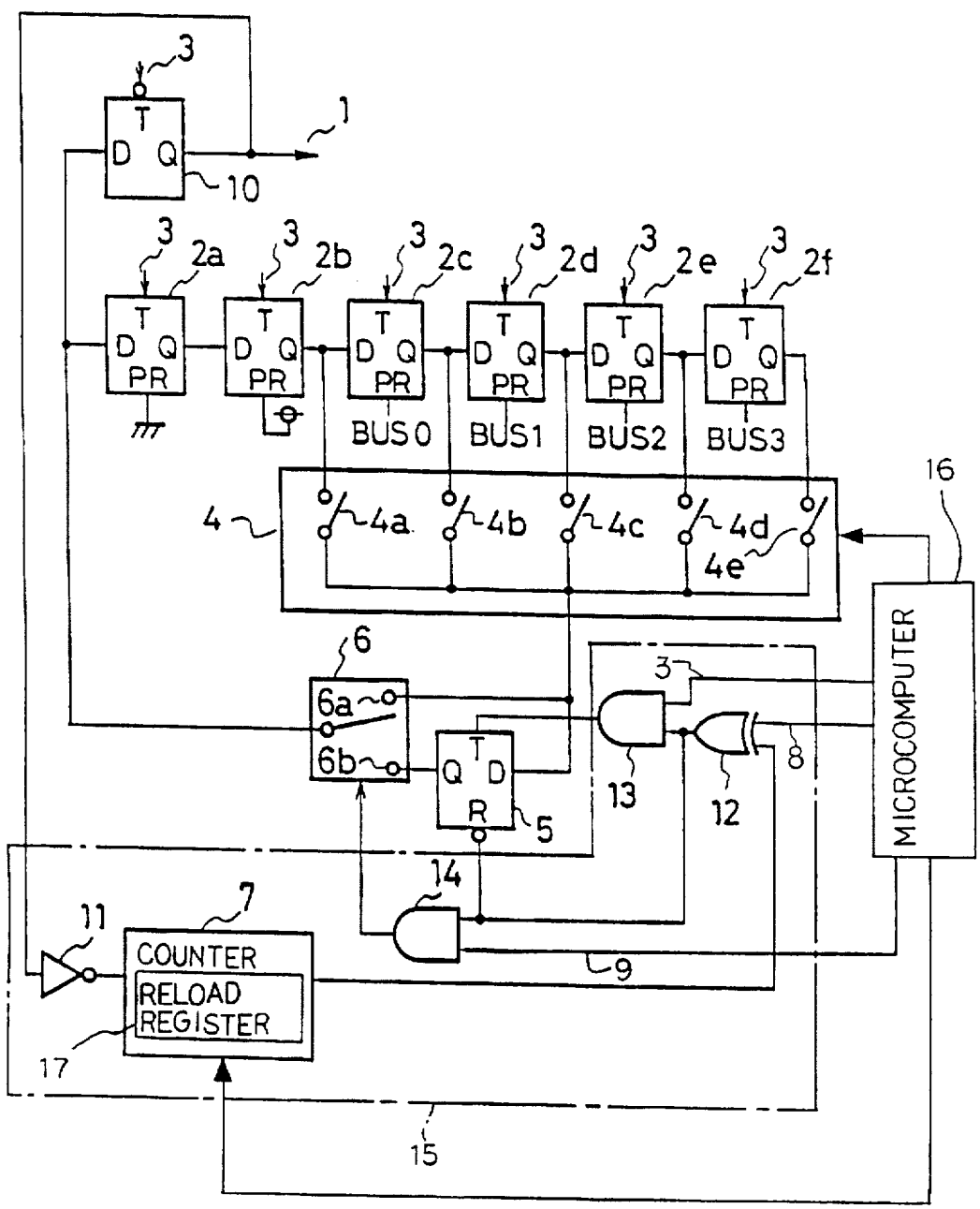
FIG. 1 is a circuit diagram showing an arrangement of a remote control transmission circuit according to an embodiment of the present invention.

An embodiment of the present invention will be described hereinbelow with reference to the drawings. In FIG. 1, numeral 1 represents a carrier output, 2a to 2f designate programmable shift circuits multistage-coupled to each other and arranged to perform the shift operations in accordance with clocks 3. At the time of programming, the first and second stage shift circuits 2a and 2b are fixed to the "L" (grounded) and "H" (positive potential), respectively. The other shift circuits 2c to 2f can be arranged to be set to given values in accordance with program instructions. Numeral 4 depicts a first switching circuit for determining the number of the basic connections of the shift circuits in this embodiment, i.e., a switching circuit for switching the number of the shift circuits to be connected, which circuit comprises switches 4a to 4e coupled to the outputs of the shift circuits 2b to 2f other than the first shift circuit 2a where only one of the switches 4a to 4e is arranged to be allowed to be connected under control of a microcomputer 16. Numeral 6 is a switch being a second switch circuit of this embodiment which is arranged to selectively take either of the state that the output of the switching circuit 4 is inputted to the aforementioned first stage shift circuit 2a as it is and the state that allows the connection to the shift circuit 2a through another shift circuit 5 which causes the "L" output in response to input of a reset signal, thereby performing a correction through the adjustment of the connection of the shift circuit 5. Numeral 10 represents a latch circuit which inputs the inversion of the clock 3 so that the output of the aforementioned change-over switch 6 is delayed by a time corresponding to ½ clock, the output thereof being the carrier output 1. Numeral 7 denotes a counter for counting down a signal (the count source) obtained by inverting the output of the latch circuit 10 through an inverter 11 and for performing the reload after the overflow so as to fix the output to "H" until the count source again rises. In this embodiment, the counter 7 is constructed with a 2-bit down-counter with a reload register 17 and the set value of the reload register is given the microcomputer 16. Numeral 8 indicates a signal for controlling that the output of an EXOR (exclusive OR) gate 12 is set to "H" in accordance with whether the output of the counter 7 is "H" or "L". The signal 8 allows the switching control, in accordance with the output of the counter 7, as to whether the correction is added or reduced. When the output of the EXOR gate 12 is "L", the clock 3 to the shift circuit 5 is stopped by means of an AND gate 13 to set it to the reset state ("L" output state) and further the change-over switch 6 is fixed to a contact 6a side (switching circuit 4 side) through an AND gate 14. On the other hand, when the output of the EXOR gate 12 is "H", the clock 3 of the shift circuit 5 is inputted so as to release it from the reset state and further to cause the change-over switch 6 to be connected to the contact 6b side (sift circuit 5 side). Here, illustrated at numeral 9 is a signal for control as to whether the correction is made or not, i.e., for control of supply of the output of the EXOR gate 12 to the change-over switch 6. When the signal 9 becomes "L", the change-over switch 6 is always coupled to the contact 6a side. The above-mentioned signals 8 and 9 are respectively given by the microcomputer. A switching control circuit 15 of this embodiment is composed of the above-mentioned counter 7, inverter 11, EXOR gate 12, AND gates 13, 14 and others.

Figure 2:
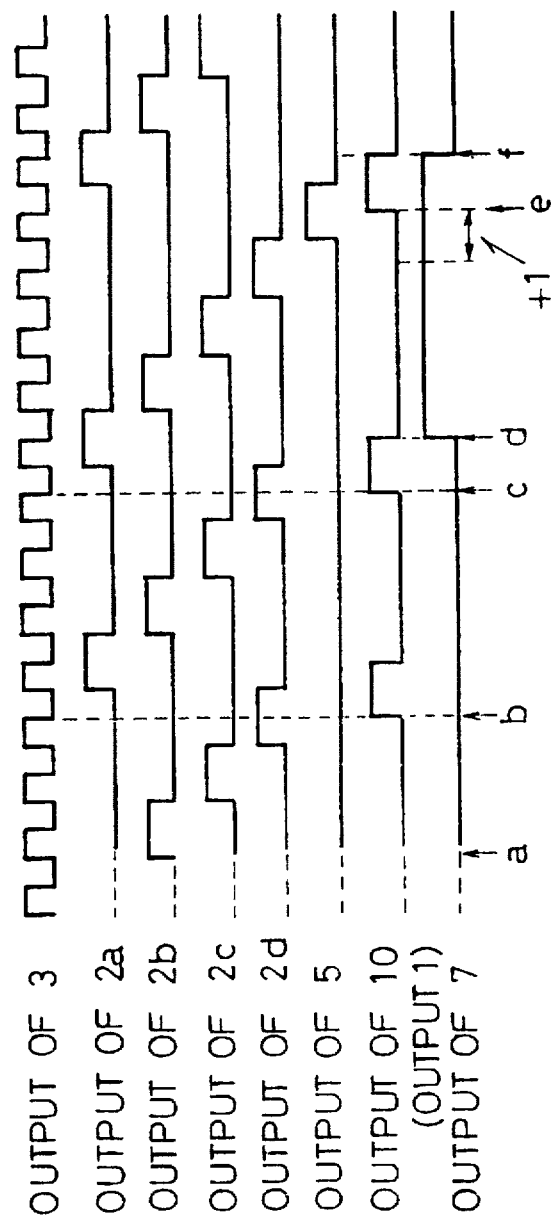
FIG. 2 is an illustration of one example of output waveforms of a remote control transmission circuit according to the embodiment.

Secondly, a description will be made hereinbelow in terms of the operation. FIG. 2 is a timing chart showing one operation of the FIG. 1 circuit. The "L" interval is lengthened by a time corresponding to one clock period one time for two periods of the carrier output 1, and for the setting, the switch 4c of the switching circuit 4 takes the coupling state and the set value of the counter 7 is "1". Further, the signal 8 is set to be "L" and the signal 9 is set to be "H" because of correction. This setting constitutes a loop comprising the sift circuits 2a, 2b, 2c and 2d. Here, the initial set values of the shift circuits 2c and 2d are respectively determined to assume the "L" outputs.

The shift operation starts from the rising of the clock 3 (point a) and as illustrated in FIG. 2 the "H" interval is shifted at every rising of the clock 3. The shift circuit 2d outputs "H" before the carrier 1 is outputted from the latch circuit 10 at the point b in FIG. 2. Thereafter, the shift operation continues so as to again output the carrier 1 at the point c in FIG. 2 and then cause the counter 7 to overflows at the point d in FIG. 2. With the change-over switch 6 being changed to the point 6b by means of this overflow signal, the connection to the shift circuit 5 is made and the reset of the shift circuit 5 is released so that the clock 3 is inputted. The shift circuit 5 is in the connecting state until the count source of the counter 7 secondly rises (the carrier 1 rises), and therefore the "H" output of the shift circuit 5 after the shift circuit 2d takes "H" is inputted to the latch circuit 10. Thus, the time period of "L" of the carrier output 1 (the time period between the points d and e) is lengthened by one clock period as compared with the time period of "L" of the previous carrier output 1. Further, after the shift circuit 5 outputs "H", the shift circuit 2a outputs "H", so that the change-over switch 6 is changed to the contact 6a side at the point f so as to again constitute a loop by the shift circuits 2a to 2d to perform the shift operation. Thereafter, the correction is automatically performed one time for two periods of the carrier output 1. The period for the correction varies in accordance with the set value of the counter 7.

Figure 3:
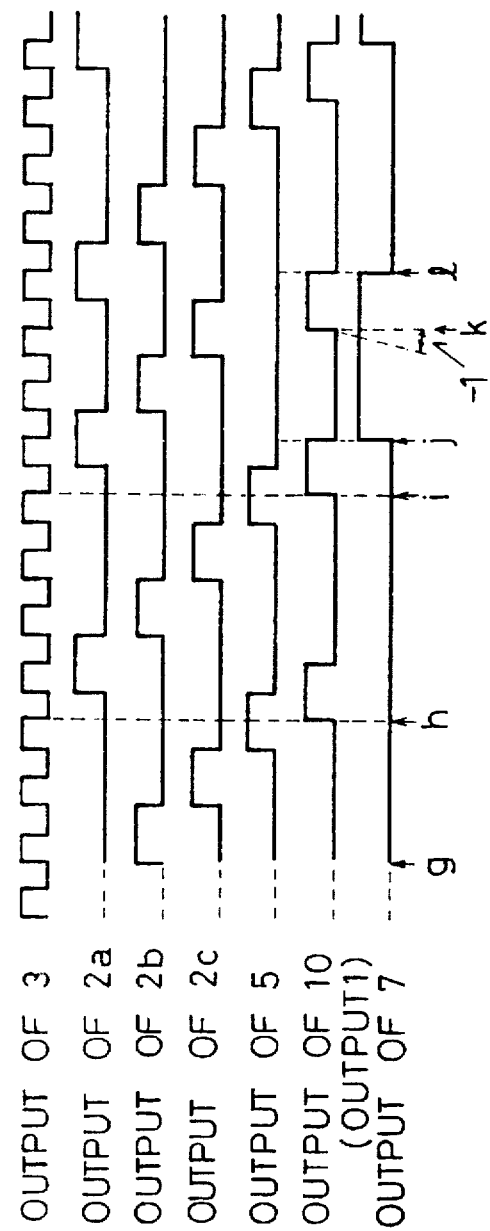
FIG. 3 is an illustration of the other example of the output waveforms of the remote control transmission circuit of this embodiment.
Figure 4:
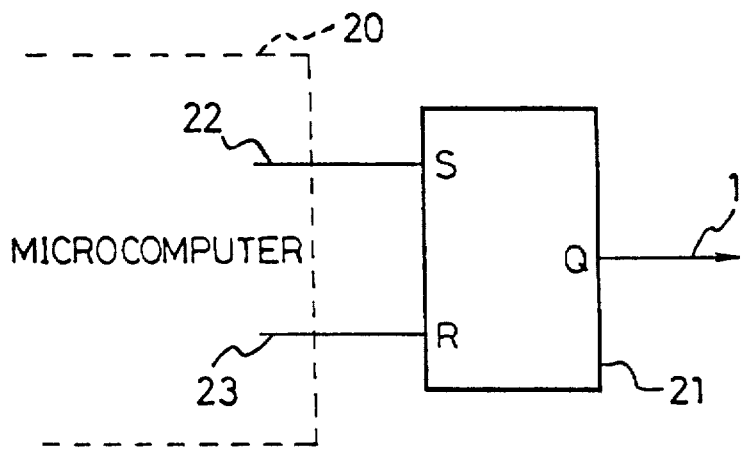
FIG. 4 is a block diagram showing a conventional remote control transmission circuit.
Figure 5:
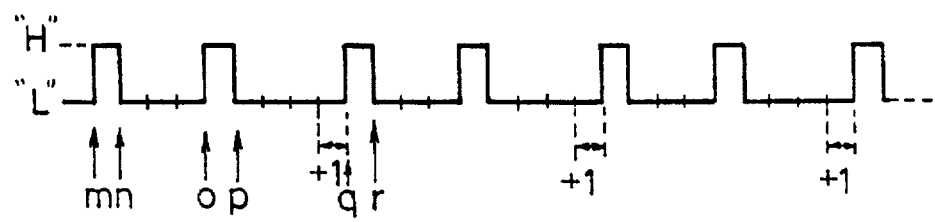
FIG. 5 is an illustration of one example of output waveforms of the conventional remote control transmission circuit.

A further description will be made hereinbelow in terms of an exemplary operation for, as illustrated in FIG. 3, shortening the time period of "L" of the carrier output 1 by one period of the clock 3 one time for two periods. In this example, the switch 4b of the switching circuit 4 is set to be in the connecting state, and the set value of the counter 7 is similarly set to "1". The signal 9 is similarly set to "H" because of the correction, while the signal 8 is set to "H". These settings constitute a loop by the shift circuit 2a, 2b, 2c and the shift circuit 5, whereby the number of the shift circuits becomes the same as in the case as illustrated in FIG. 2. Similarly, the initial set value of the shift circuit 2c is arranged to take the "L" output.

Similarly to the operation before the point g in FIG. 3, the shift operation starts so that the "H" output of the shift circuit 5 is inputted to the latch circuit 10 and the carrier 1 is outputted at the point h. Thereafter, the sift operation continues so as to again output the carrier 1 at the point i and then to cause the counter 7 to overflows at the point i (the rising of the count source of the counter 7) to output "H". Since the signal 8 is "H", the exclusive OR output of the EXOR gate 12 becomes "L" so that the clock 3 for the shift circuit 5 is stopped to enter into the reset state. Moreover, the change-over switch 6 is connected to the contact 6a side so as to constitute a loop comprising the sift circuits 2a, 2b and 2c. Since this state is kept until the point 1 at which the count source of the counter 7 secondly rises (the output of the latch circuit 10 rises), the "H" output of the shift circuit 2c is inputted to the latch circuit 10 so that the carrier 1 is outputted at the point k. At this time, the time period of the "L" of the carrier output 1 (between the points i and k) is shortened by one period of the clock 3 as compared with the period of "L" of the previous carrier output 1. Thereafter, the shift circuit 2c outputs "H" and the reset state of the shift circuit 5 is released at the point 1 after the "H" output of the shift circuit 2a and the clock 3 is inputted. Simultaneously, the change-over switch 6 is connected to the contact 6b side so as to again constitute a loop by the shift circuits 2a to 2c and the shift circuit 5 to perform the shift operation. Thereafter, the correction is automatically effected one time for two periods of the carrier output 1. As well as in the case of FIG. 2, the period for the correction varies in accordance with the set value of the counter 7. Here, the number of the shift circuits, the kind of the counter and others are not limited to those taken in the above-described embodiment but are adequately determined in correspondence with the frequency and format of a desired carrier output.

As described above, according to this invention, the remote control transmission circuit comprises the plurality of shift circuits, the first switching circuit for determining the number of the basic connections of the shift circuits, the second switching circuit for controlling the switching between the case that a loop is constituted by only the shift circuits determined by the first switching circuit and the case that the loop is constituted by newly adding a shift circuit, and the switching control circuit for counting the output of the loop to change over the second switching circuit at a predetermined time interval, so that the multicarrier is constituted with the hardware and outputted. Thus, for generating the multicarrier by a single microcomputer, it is possible to reduce the number of the program commands and further to easily perform a different process during the output of the carrier.

What is claimed is:

1. A remote control transmission circuit comprising:

a plurality of first shift circuits;

a first switching circuit, coupled to said plurality of first shift circuits, for setting the number of basic connections of said plurality of first shift circuits in response to a control signal;

a second shift circuit coupled to said first switching circuit;

a second switching circuit coupled to a first-stage shift circuit of said plurality of first shift circuits and coupled to a last-stage shift circuit of said plurality of shift circuits resulting from determination of the number of basic connections by said first switching circuit, and further coupled to said second shift circuit by releasing its connection with said last-stage shift circuit when activated; and a switching control circuit, coupled to said second switching circuit, for counting an output from said second switching circuit to said first-stage shift circuit and activating said second switching circuit at a predetermined period.

2. The remote control transmission circuit as claimed in claim 1, wherein said first plurality of shift circuits comprises shift circuits arranged to be multistage-coupled to each other and programmable and wherein said second shift circuit produces a "L" output from a set of possible binary outputs comprising "H" and "L" in response to an input of a reset signal.

3. The remote control transmission circuit as claimed in claim 2, wherein said first switching circuit comprises a plurality of switches independently coupled to the outputs of said multistage-coupled shift circuits so as to constitute a switching circuit for allowing closure of only one switch of said plurality of switches in accordance with a setting of a microcomputer.

4. The remote control transmission circuit as claimed in claim 2, wherein said second switching circuit comprises a change-over switch for performing a change-over operation to couple an output of a last-stage shift circuit of said plurality of first shift circuits resulting from determination of the number of basic connections by said first switching circuit via said first switching circuit to said first-stage shift circuit or to couple an output of said last-stage shift circuit resulting from determination of the number of basic connections by said first switching circuit via said first switching circuit and said second shift circuit to said first-stage shift circuit.

5. The remote control transmission circuit as claimed in claim 1, further comprising a latch circuit which delays the output of said first plurality of shift circuits and said second shift circuit by a ½ clock period so as to generate a carrier output.

6. The remote control transmission circuit as claimed in claim 1, wherein said switching control circuit comprises a counter having a reload register which is set by a microcomputer.

7. The remote control transmission circuit as claimed in claim 2, wherein said switching control circuit comprises a counter having a reload register which is set by a microcomputer, and a logic circuit, coupled to said counter, to said second switching circuit, and to said microcomputer, for controlling said second switching circuit and producing said reset signal according to an output of said counter and signals output from said microcomputer to indicate whether a correction of a carrier output is made or not and whether said correction is added or reduced.

* * * * *